(12) United States Patent
Blayvas et al.

(10) Patent No.: US 12,033,831 B2
(45) Date of Patent: Jul. 9, 2024

(54) ANALYZING A SIDEWALL OF HOLE MILLED IN A SAMPLE TO DETERMINE THICKNESS OF A BURIED LAYER

(71) Applicant: Applied Materials Israel Ltd., Rehovot (IL)

(72) Inventors: Ilya Blayvas, Jerusalem (IL); Yehuda Zur, Tel-Aviv (IL)

(73) Assignee: Applied Materials Israel Ltd., Rehovot (IL)

( * ) Notice: Subject to any disclaimer, the term of this patent is extended or adjusted under 35 U.S.C. 154(b) by 515 days.

(21) Appl. No.: 17/408,876

(22) Filed: Aug. 23, 2021

(65) Prior Publication Data

US 2023/0057148 A1   Feb. 23, 2023

(51) Int. Cl.
*H01J 37/302* (2006.01)
*H01J 37/28* (2006.01)
*H01J 37/305* (2006.01)
*H01L 21/66* (2006.01)

(52) U.S. Cl.
CPC .......... *H01J 37/3023* (2013.01); *H01J 37/28* (2013.01); *H01J 37/305* (2013.01); *H01L 22/12* (2013.01); *H01J 2237/24578* (2013.01); *H01J 2237/24585* (2013.01); *H01J 2237/2814* (2013.01); *H01J 2237/31749* (2013.01)

(58) Field of Classification Search
CPC ........ H01J 37/00; H01J 37/02; H01J 37/3023; H01J 37/28; H01J 37/26; H01J 37/305; H01J 37/302; H01J 37/265; H01J 2237/24578; H01J 2237/24585; H01J 2237/2814; H01J 2237/31749; H01J 2237/2815; H01J 2237/3174; H01L 22/12

USPC .......................................... 250/306, 307, 311
See application file for complete search history.

(56) References Cited

U.S. PATENT DOCUMENTS

| 5,443,684 A | 8/1995 | Eckart et al. |
| 6,670,610 B2 | 12/2003 | Shemesh et al. |
| 7,518,109 B2 | 4/2009 | Ikku et al. |

(Continued)

FOREIGN PATENT DOCUMENTS

| KR | 10-2009-0091157 A | 8/2009 |
| WO | 2020/237105 A1 | 11/2020 |

OTHER PUBLICATIONS

International Search Report and Written Opinion for Application No. PCT/US2022/035227, mailed Oct. 13, 2022, 11 pages.

(Continued)

*Primary Examiner* — Jason L McCormack
(74) *Attorney, Agent, or Firm* — Kilpatrick Townsend & Stockton LLP

(57) ABSTRACT

Analyzing a sidewall of a hole milled in a sample to determine thickness of a buried layer includes milling the hole in the sample using a charged particle beam of a focused ion beam (FIB) column to expose the buried layer along the sidewall of the hole. After milling, the sidewall of the hole has a known slope angle. From a perspective relative to a surface of the sample, a distance is measured between a first point on the sidewall corresponding to an upper surface of the buried layer and a second point on the sidewall corresponding to a lower surface of the buried layer. The thickness of the buried layer is determined using the known slope angle of the sidewall, the distance, and the angle relative to the surface of the sample.

18 Claims, 11 Drawing Sheets

(56) References Cited

U.S. PATENT DOCUMENTS

| | | |
|---|---|---|
| 8,709,269 B2 | 4/2014 | Shemesh |
| 9,046,475 B2 | 6/2015 | Langer et al. |
| 10,204,762 B2 | 2/2019 | Fuller et al. |
| 10,217,621 B2 | 2/2019 | Ruach-Nir et al. |
| 11,598,633 B2 | 3/2023 | Mairov et al. |
| 2002/0074494 A1 | 6/2002 | Lundquist et al. |
| 2003/0015660 A1* | 1/2003 | Shishido ........... H01L 21/67276 |
| | | 250/311 |
| 2005/0100205 A1* | 5/2005 | Shishido ................. H01L 22/34 |
| | | 382/145 |
| 2005/0173631 A1 | 8/2005 | Ray et al. |
| 2012/0326028 A1 | 12/2012 | Muto et al. |
| 2018/0005906 A1 | 1/2018 | Sagawa et al. |
| 2019/0170509 A1 | 6/2019 | Kawada |
| 2020/0013603 A1 | 1/2020 | Ruach-Nir et al. |
| 2023/0197403 A1* | 6/2023 | Miller ................. H01J 37/3053 |
| | | 250/307 |

OTHER PUBLICATIONS

International Search Report and Written Opinion for Application No. PCT/US2022/038945, mailed Nov. 16, 2022, 9 pages.
U.S. Appl. No. 17/378,999 Notice of Allowance mailed Dec. 22, 2022, 8 pages.
International Preliminary Report on Patentability for Application No. PCT/US2022/038945, mailed Mar. 7, 2024, 6 pages.
Hill et al., "FIB Endpoint Detection and Depth Resolution," Microelectronic Engineering 21, 1993, pp. 201-204.
U.S. Appl. No. 17/011,955 Notice of Allowance mailed Sep. 9, 2021, 9 pages.
International Preliminary Report on Patentability for Application No. PCT/US2022/035227, mailed Feb. 1, 2024, 8 pages.

* cited by examiner

ANALYZING A SIDEWALL OF HOLE MILLED IN A SAMPLE TO DETERMINE THICKNESS OF A BURIED LAYER

BACKGROUND

In the study of electronic materials and processes for fabricating such materials into an electronic structure, a specimen of the electronic structure can be used for microscopic examination for purposes of failure analysis and device validation. For instance, a specimen such as a silicon wafer that includes one or more electronic structures formed thereon can be milled with a focused ion beam (FIB) and analyzed to study specific characteristics of the structures formed on the wafer.

Many modern electronic structures include different alternating layers of material in one or more portions of the structure. Important characteristics of these layers include composition and thickness. To determine thickness, specimens can be milled with a FIB, and layer thickness can be determined using, for example, optical microscopy, transmission electron microscopy (TEM), or scanning electron microscopy (SEM) techniques. These techniques can provide accurate thickness measurements, but they generally require the specimen to be carefully milled with a FIB to provide a cross-section so that the measurements can be performed. This milling step can be time consuming.

Improved methods for measuring thickness of buried layers on specimens are desired.

SUMMARY

Embodiments described herein provide improved systems and methods for measuring thickness of buried layers on specimens. Some embodiments can reduce measurement or analysis time and/or may be performed in-line during sample fabrication. In some embodiments, a hole or divot is milled in a specimen or sample using a FIB to expose a buried layer along the sidewall. The hole may be milled to have a Gaussian shape with sloped sidewalls having a known slope angle. The hole can be milled relatively quickly compared to milling the cross-section used for conventional optical and SEM techniques. Distances between upper and lower surfaces of the buried layer along the sidewall may be obtained, and the thickness of the buried layer may be determined as described herein.

In accordance with an embodiment, an inspection system for analyzing a sidewall of a hole milled in a sample to determine thickness of a buried layer includes a FIB column, a SEM column, and a computer readable medium comprising instructions that when executed cause the inspection system to perform steps comprising: milling the hole in the sample using a charged particle beam of the FIB column to expose the buried layer along the sidewall of the hole, wherein after milling the sidewall of the hole has a known slope angle; measuring, using the SEM column, a distance between a first point on the sidewall corresponding to an upper surface of the buried layer and a second point on the sidewall corresponding to a lower surface of the buried layer, wherein the measurement is obtained from a perspective associated with an angle relative to a surface of the sample, and the distance measured is projected onto a horizontal plane or a vertical plane; and determining a thickness of the buried layer using the known slope angle of the sidewall, the distance, and the angle relative to the surface of the sample.

In an embodiment, the thickness of the buried layer is a vertical distance between the upper surface of the buried layer and the lower surface of the buried layer.

In another embodiment, the angle of the SEM column relative to the surface of the sample is approximately 45°, and the distance projected onto the horizontal plane is the same as the distance projected onto the vertical plane.

In another embodiment, a line extending vertically through the buried layer is approximately normal to the upper surface of the buried layer or the lower surface of the buried layer.

In another embodiment, the computer readable medium further comprises instructions that when executed cause the inspection system to measure a plurality of distances between first points on the sidewall corresponding to the upper surface of the buried layer and second points on the sidewall corresponding to the lower surface of the buried layer, wherein the distance is a shortest one of the plurality of distances.

In another embodiment, the computer readable medium further comprises instructions that when executed cause the inspection system to mill the hole with the charged particle beam in a de-focused mode.

In another embodiment, the computer readable medium further comprises instructions that when executed cause the inspection system to mill the hole without scanning the charged particle beam.

In yet another embodiment, the charged particle beam of the FIB column is generated using a plasma xenon source.

In accordance with another embodiment, for example, a method for analyzing a sidewall of a hole milled in a sample to determine thickness of a buried layer includes milling the hole in the sample using a charged particle beam of a FIB system to expose the buried layer along the sidewall of the hole, wherein the hole is milled without scanning the charged particle beam, and after milling, the sidewall of the hole has a known slope angle; measuring, using a scanning electron microscopy (SEM) column, a distance between a first point on the sidewall corresponding to an upper surface of the buried layer and a second point on the sidewall corresponding to a lower surface of the buried layer, wherein the measurement is obtained from a perspective associated with an angle relative to a surface of the sample; and determining a thickness of the buried layer using the known slope angle of the sidewall, the distance, and the angle relative to the surface of the sample.

In an embodiment, the thickness of the buried layer is a vertical distance between the upper surface of the buried layer and the lower surface of the buried layer.

In another embodiment, the method also includes measuring a plurality of distances between first points on the sidewall corresponding to the upper surface of the buried layer and second points on the sidewall corresponding to the lower surface of the buried layer, wherein the distance is a shortest one of the plurality of distances.

In some embodiments, the hole is milled with the charged particle beam in a focused mode, while in other embodiments, the hole is milled with the charged particle beam in a de-focused mode.

In another embodiment, the hole is milled without scanning the charged particle beam.

In another embodiment, the buried layer on the sample underlies an overlying layer on the sample.

In another embodiment, the sample is a semiconductor wafer.

In another embodiment, the distance as measured by the SEM column is projected onto a horizontal plane or a vertical plane In yet another embodiment, the method also includes monitoring a fabrication process using the thickness of the buried layer.

To better understand the nature and advantages of the present disclosure, reference should be made to the following description and the accompanying figures. It is to be understood, however, that each of the figures is provided for the purpose of illustration only and is not intended as a definition of the limits of the scope of the present disclosure. Also, as a general rule, and unless it is evident to the contrary from the description, where elements in different figures use identical reference numbers, the elements are generally either identical or at least similar in function and purpose.

DETAILED DESCRIPTION

Embodiments described herein provide methods for determining thicknesses of buried layers on specimens. The methods involve milling a hole in a sample to expose the buried layer along the sidewall. A projected thicknesses of the buried layer is measured and used to determine a vertical thickness of the buried layer. Distances between layers can also be determined using embodiments described herein (e.g., a distance between layers having one or more intermediate layers therebetween).

Figure 1A:
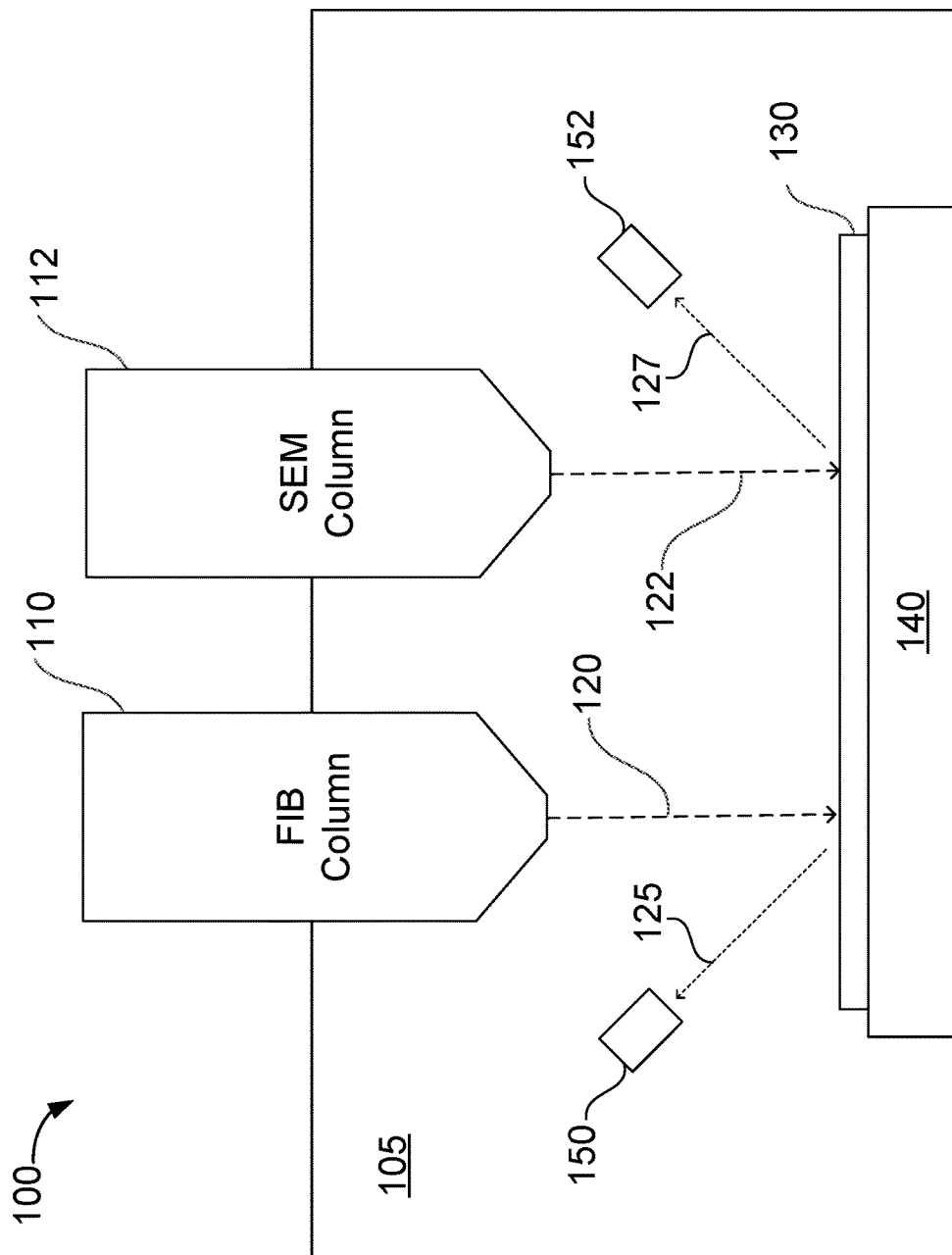
FIGS. 1a-1b are simplified illustrations of an exemplary inspection system according to some embodiments.
Figure 1B:
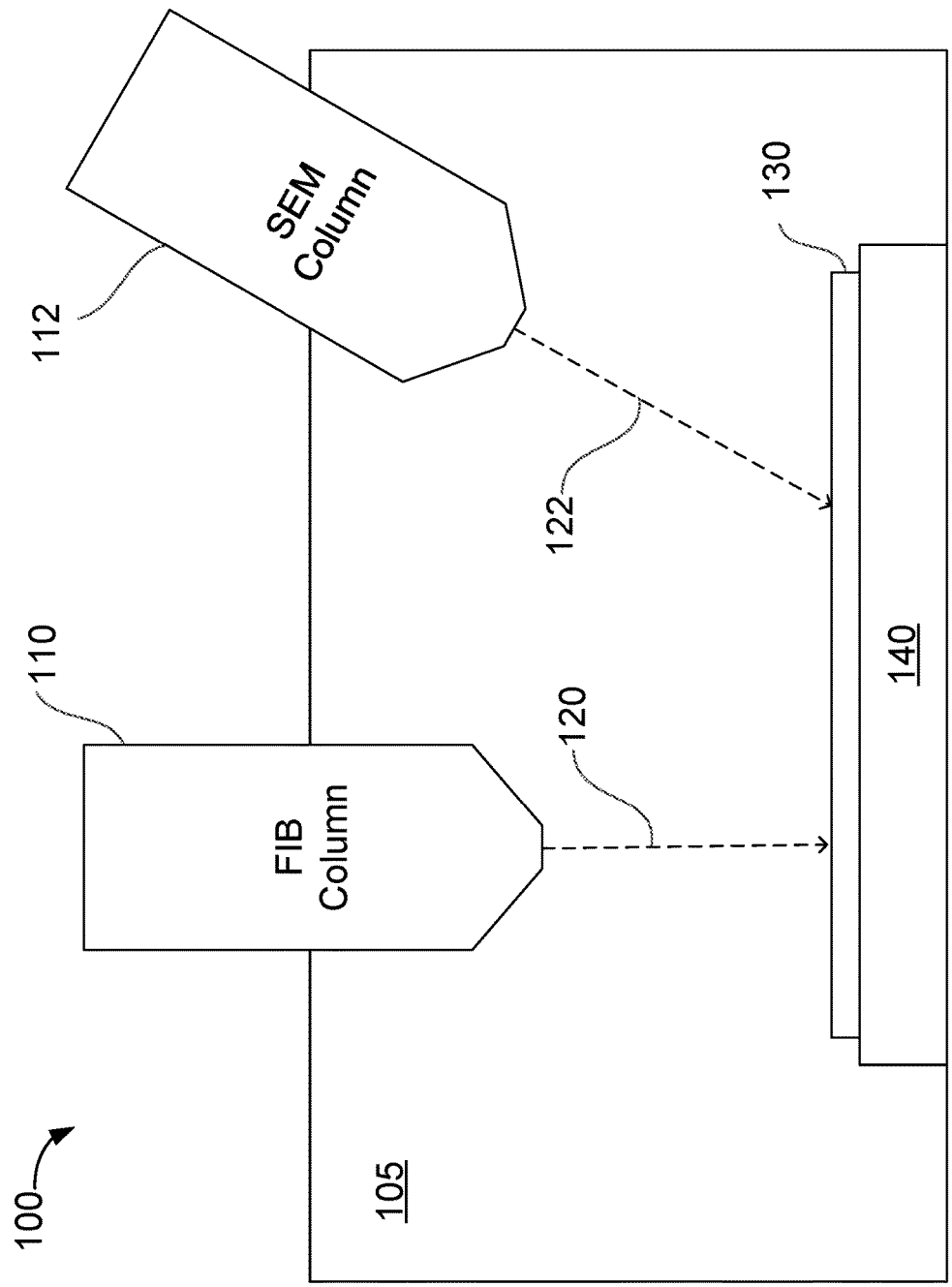

In order to better understand and appreciate the disclosure, reference is first made to FIGS. 1a-1b, which are simplified schematic illustrations of an exemplary inspection system 100 according to some embodiments of the disclosure. Inspection system 100 can be used for, among other operations, defect review and analysis of structures formed on semiconductor wafers.

As shown in FIG. 1a, system 100 can include, among other elements, a FIB column 110, a SEM column 112, a sample supporting element 140, and optionally secondary electron detectors 150, 152 (or in some embodiments, secondary ion detectors, or a combination of the two detectors working in parallel). FIB column 110 is operable to generate a charged particle beam 120 and direct the charged particle beam 120 towards a sample 130 (sometimes referred to herein as an "object" or a "specimen") to mill or otherwise process the sample. SEM column 112 can generate an image of a portion of sample 130 by illuminating the sample with a charged particle beam, detecting particles emitted due to the illumination, and generating charged particle images based on the detected particles. The sample, for example a semiconductor wafer, can be supported on the sample supporting element 140 within a vacuum chamber 105. Supporting element 140 can also move the sample within vacuum chamber 105 between the field of view of the two columns 110 and 112 as required for processing. For example, the FIB column 110 may be used to mill the sample 130, and the supporting element 140 may move the sample so that the SEM column 112 can image the milled portion of the sample 130.

The FIB column 110 can mill (e.g., remove portions of) the sample 130 by irradiating the sample 130 with the charged particle beam 120. A FIB milling process typically operates by positioning the specimen in a vacuum chamber 105 and emitting a beam of ions towards the specimen to etch or mill away material on the specimen. Common milling processes form a cross section of the sample 130 and, if desired, can also smooth the cross section. In some instances, the vacuum environment can be purged with background gases that serve to control the etch speed and other parameters. The accelerated ions can be generated from Xenon, Gallium or other appropriate elements and are typically accelerated towards the specimen by voltages in the range of 500 volts to 100,000 volts, and more, typically falling in the range of 3,000 volts to 30,000 volts. The beam current is typically in the range from several pico amps to several micro amps, depending on the FIB instrument configuration and the particular application, and the pressure is typically controlled between $10^{-10}$ to $10^{-5}$ mbar in different parts of the system and in different operation modes.

As used with the embodiments described herein, the milling process may form a recess or hole in the sample 130. The hole may be formed by milling the sample 130 without scanning the charged particle beam 120. The hole may be on the order of a few hundreds of nanometers to a few hundreds of microns in lateral dimensions.

During a milling operation, the charged particle beam 120 generated by the FIB column 110 propagates through a vacuum environment formed within vacuum chamber 105 before impinging on the sample 130. Secondary electrons and ions 125 are generated in the collision of ions with the sample and are detected by the detector 150. The detected secondary electrons or ions 125 can be used to analyze characteristics of the milled layers and the structure, can be used to determine an endpoint of a milling process, and/or can be used to form an images.

During a particle imaging operation, the charged particle beam 122 generated by the SEM column 112 propagates through the vacuum environment formed within the vacuum chamber 105 before impinging on the sample 130. Secondary electrons 127 are generated in the collision of electrons with the sample 130 and are detected by the detector 152. The detected secondary electrons 127 can be used to form images of the milled area and/or to analyze characteristics of the milled layers and the structure.

FIG. 1B shows the inspection system 100 with the SEM column 112 tilted. As explained more fully below, the SEM column 112 may be tilted relative to a surface of the sample 130 to obtain images from different angles relative to a surface of the sample 130 (or from different perspectives). Alternatively, the supporting element 140 may be configured to tilt the sample 130 so that images can be obtained from different angles. The detectors 150, 152 are not shown in FIG. 1B for ease of illustration.

While not shown in FIGS. 1a-1b, the inspection system 100 can include a number of additional components including, but not limited to, one or more gas nozzles to deliver process gases to the vacuum chamber 105, vacuum and other valves to control the pressure within the vacuum chamber 105, one or more lenses to direct the charged particle beams 120, 122, and other components. System 100 can also include one or more controllers, processors or other hardware units that control operation of the system 100 by executing computer instructions stored in one or more computer-readable memories as would be known to persons of ordinary skill in the art. By way of example, the computer-readable memories can include a solid-state memory (such as a random access memory (RAM) and/or a read-only memory (ROM), which can be programmable, flash-updateable and/or the like), a disk drive, an optical storage device or similar non-transitory computer-readable storage mediums.

The inspection system 100 shown in FIGS. 1a-1b is provided as an example of a system that may be used with some of the embodiments described herein. It should be appreciated that the embodiments are not limited to the inspection system 100, and other inspection systems may be used with some embodiments. Also, in some embodiments, a FIB tool may be used to mill a hole in a sample, and a separate SEM tool may be used to obtain images of the hole.

Figure 2:
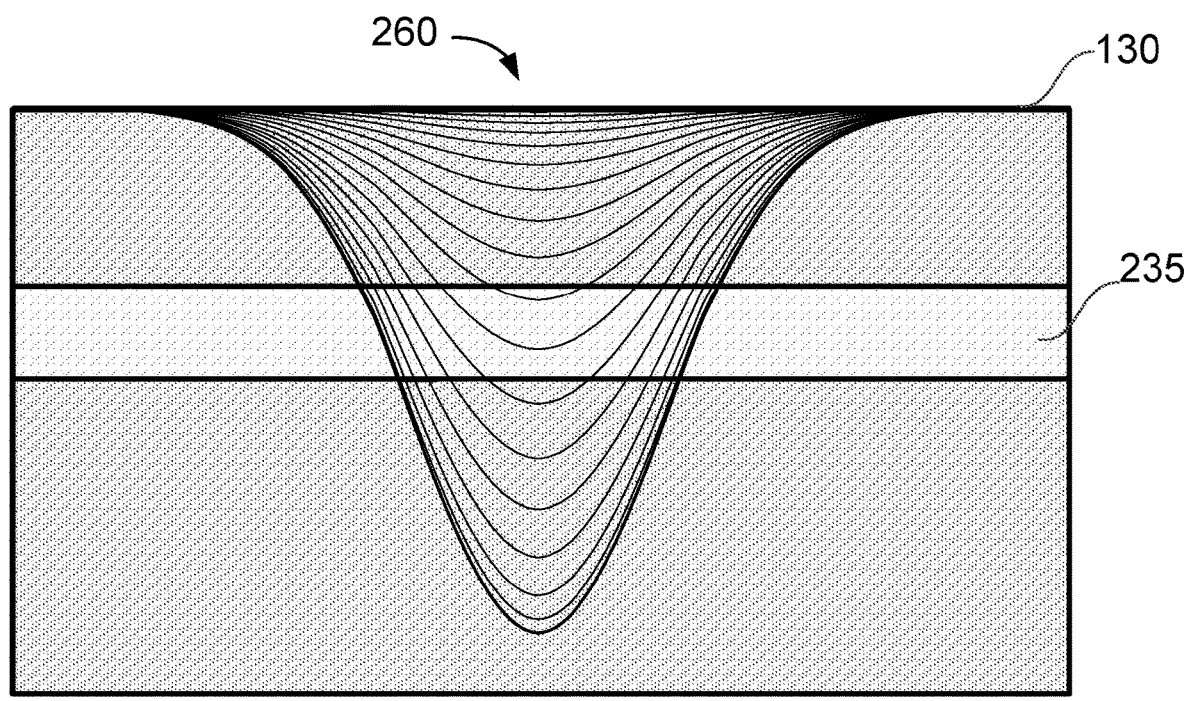
FIG. 2 is a simplified cross-sectional view of a hole milled on a specimen or sample using a charged particle beam of a FIB system according to an embodiment.

FIG. 2 is a simplified cross-sectional view of a hole 260 milled on a sample 130 using a charged particle beam of a FIB system according to an embodiment. The hole 260 is a Gaussian-shaped recess in the sample 130 so that the hole 260 has sloped sidewalls. In some embodiments, the hole 260 may be formed using a Gaussian-shaped charged particle beam, and the hole 260 may be formed without scanning the charged particle beam across the sample 130. The hole 260 may be formed using a focused or de-focused charged particle beam. A shape of the hole may approximate the Gaussian-shaped charged particle beam.

In the example of FIG. 2, the sample 130 includes a buried layer 235. The buried layer 235 may have a different composition or structure than adjacent layers in the sample 130. Although only a single buried layer 235 is shown in this example, the sample 130 may include multiple layers in other embodiments (e.g., multiple thin film layers on a semiconductor wafer).

As can be seen in this example, the sidewalls of the hole 260 have a central portion with a relatively constant slope angle. A hole can be milled and details of the profile of the hole, including the relatively constant slope angle along the central portion of the hole, can be determined from a cross-section of the hole obtained using, for example, known FIB milling and SEM imaging techniques. While the profile of the hole is depicted in the figures as being smooth, it should be appreciated that the profile may be rough and jagged on a micro-level without significantly impacting the measurement techniques described herein.

Parameters of the FIB milling process can be tuned so that the charged particle beam is rotationally symmetric and the buried layer falls within the region of relatively constant slope angle. Milling holes in other samples with similar layers and using similar milling conditions will provide a similar profile, and a slope angle of the central portion of the holes will be approximately the same between the samples. As explained more fully below, this slope angle can be used to determine a thickness of a buried layer.

Figure 3:
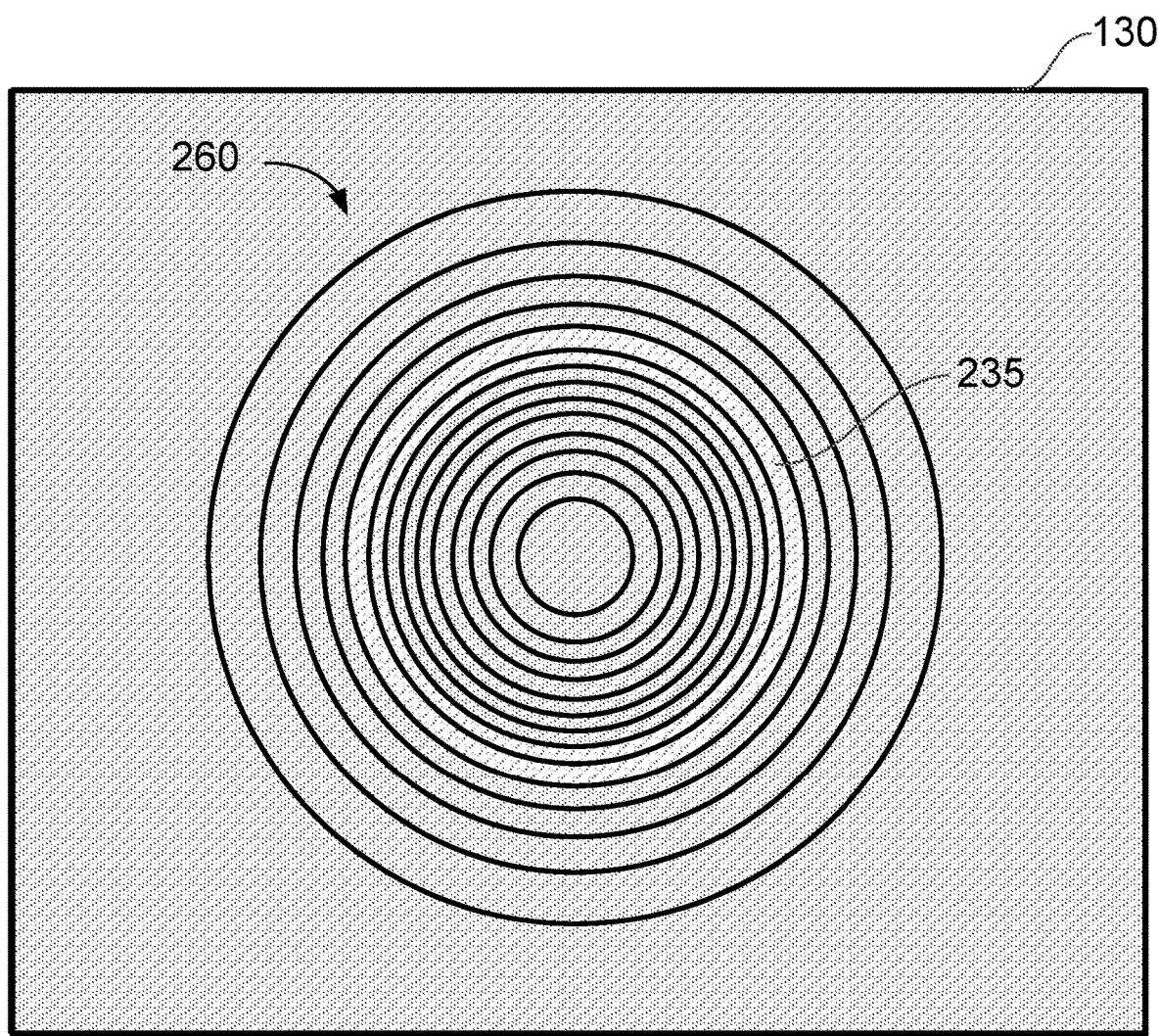
FIG. 3 is a simplified illustration of the hole shown in FIG. 2 from a top-down perspective according to an embodiment.

FIG. 3 is a simplified illustration of the hole 260 shown in FIG. 2 from a top-down perspective according to an embodiment. From this perspective, the buried layer 235 can be seen along the sloped sidewall of the hole 260. In some embodiments, the top-down perspective may be approximately normal to a surface of the sample 130 (e.g., within a few degrees).

Figure 4:
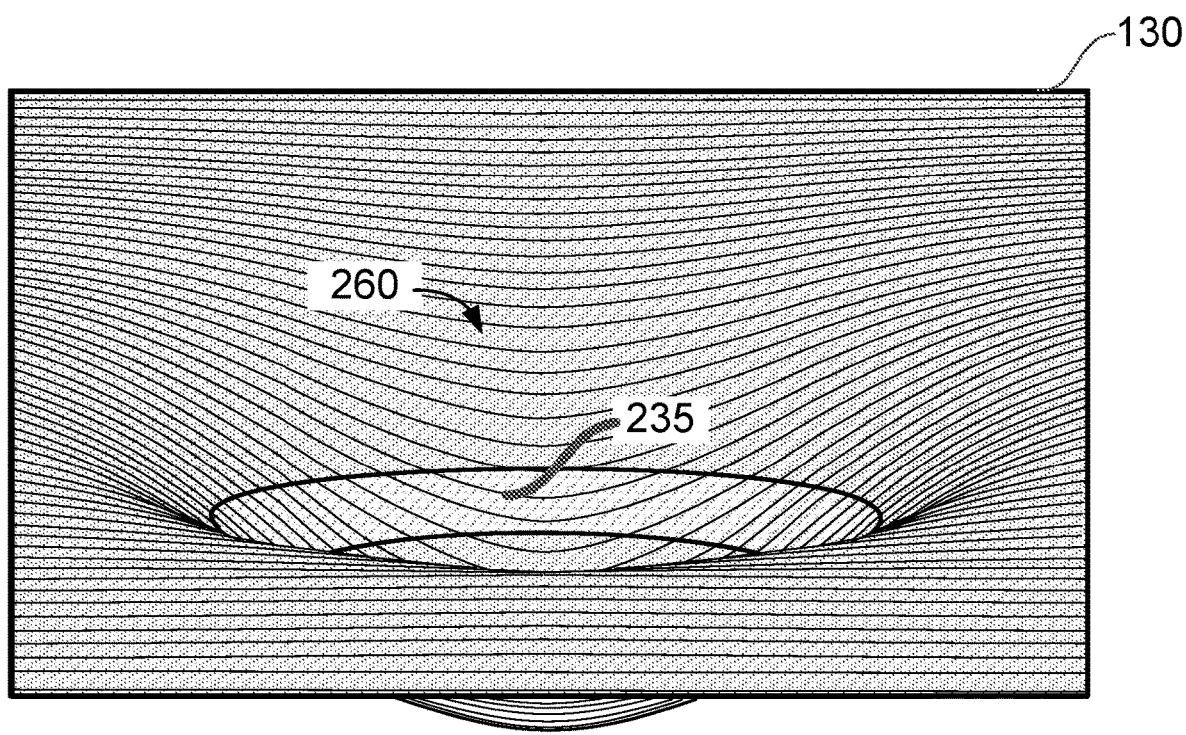
FIG. 4 is a simplified illustration of the hole shown in FIG. 2 from a tilted perspective according to an embodiment.

FIG. 4 is a simplified illustration of the hole shown in FIG. 2 from a tilted perspective according to an embodiment. From this perspective, the buried layer 235 can be seen along the sloped sidewall of the hole 260. In some embodiments, the tilted perspective may be approximately 45° to a surface of the sample 130 (e.g., within a few degrees).

Although FIGS. 2-4 are not intended to be drawn to scale or even use the same scale, they are intended to illustrate that an apparent thickness of the buried layer 235, as indicated by a distance between a top surface of the buried layer 235 and a bottom surface of the buried layer 235, varies depending on the perspective from which the buried layer 235 is viewed. More specifically, a distance between the top and bottom surfaces of the buried layer 235 increases as a tilt angle increases, reaching a maximum at a particular tilt angle that depends on the slope of the sidewall, and then decreases with further increases in the tilt angle. This is shown in FIGS. 3-4, where the distance increases between the top-down perspective of FIG. 3 and the tilted perspective of FIG. 4.

Figure 5:
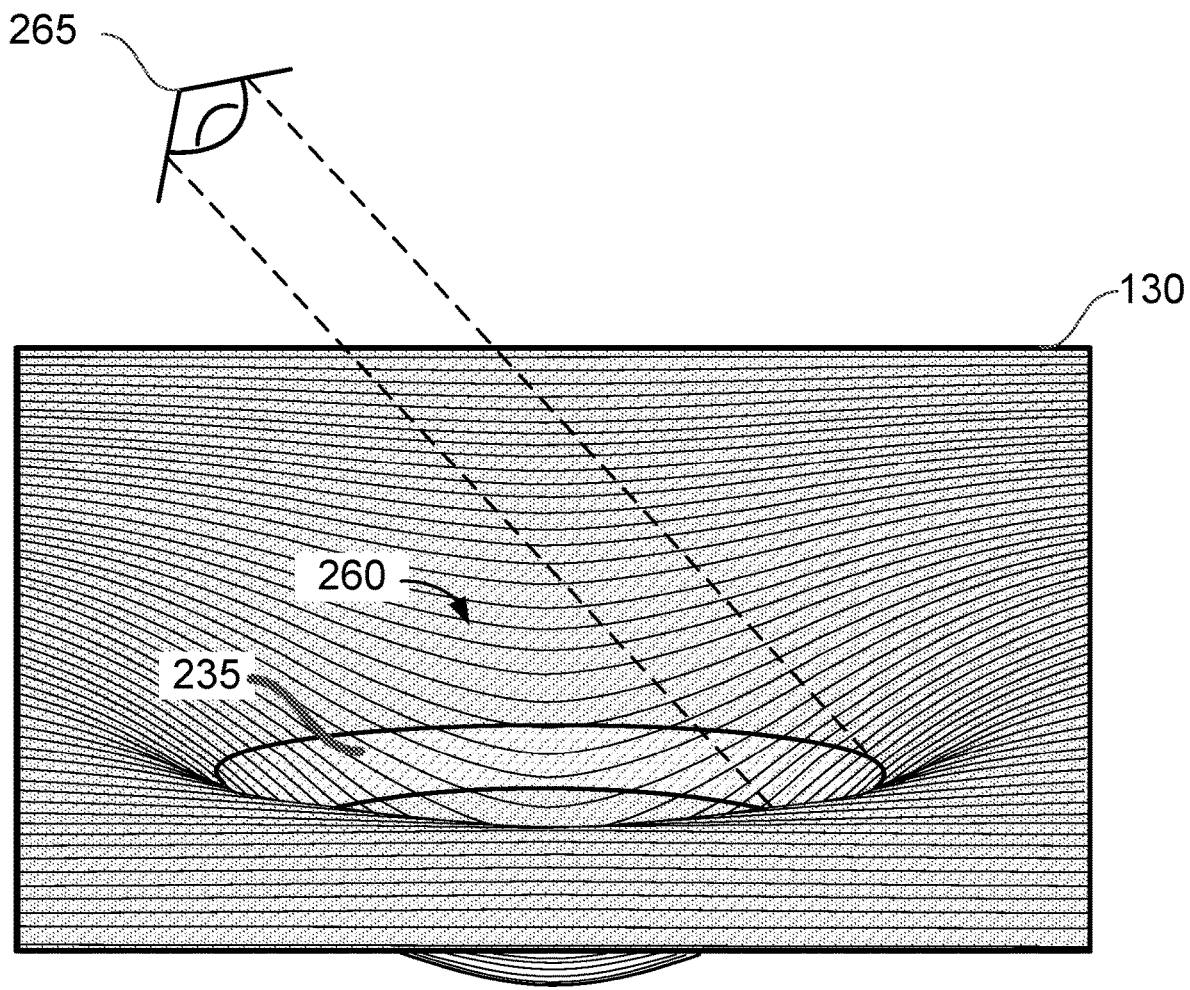
FIG. 5 is a simplified diagram illustrating how an image of a buried layer on a sidewall of a hole can be obtained according to an embodiment.

In accordance with some embodiments, a thickness of the buried layer 235 (a vertical thickness) may be determined using a distance measured between the top and bottom surfaces of the buried layer 235. FIG. 5 is a simplified diagram illustrating how an image of a buried layer 235 on a sidewall of a hole 260 can be obtained according to an embodiment. In this example, an image may be obtained from a titled perspective 265. The image may be obtained using any type of imaging device or technique that allows distance measurements to be obtained between points in the image. Examples include optical or SEM devices and techniques. A distance between points on the upper and lower surfaces of the buried layer 235 can be measured using the image. It should be appreciated that a field of view of the imaging device may include a larger portion of the hole 260 or the sample 130 than just the buried layer 235.

Figure 6A:
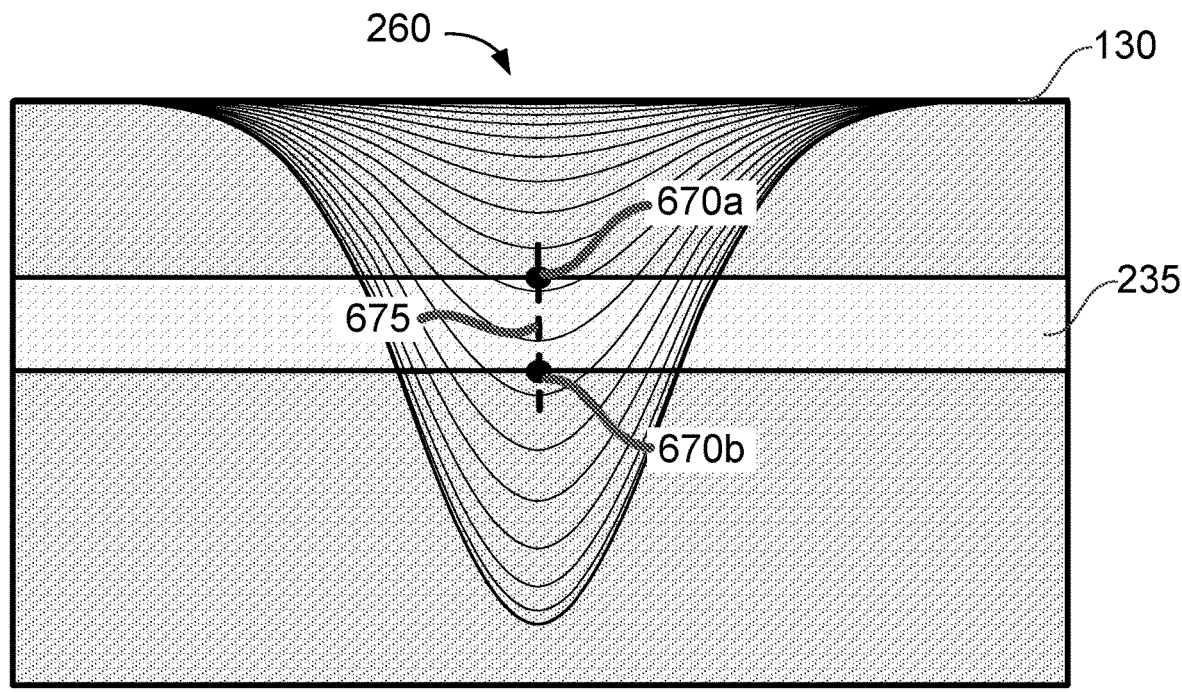
FIGS. 6a-6b are simplified cross-sectional views of a hole milled on a sample showing points on upper and lower surfaces of a buried layer according to some embodiments.
Figure 6B:
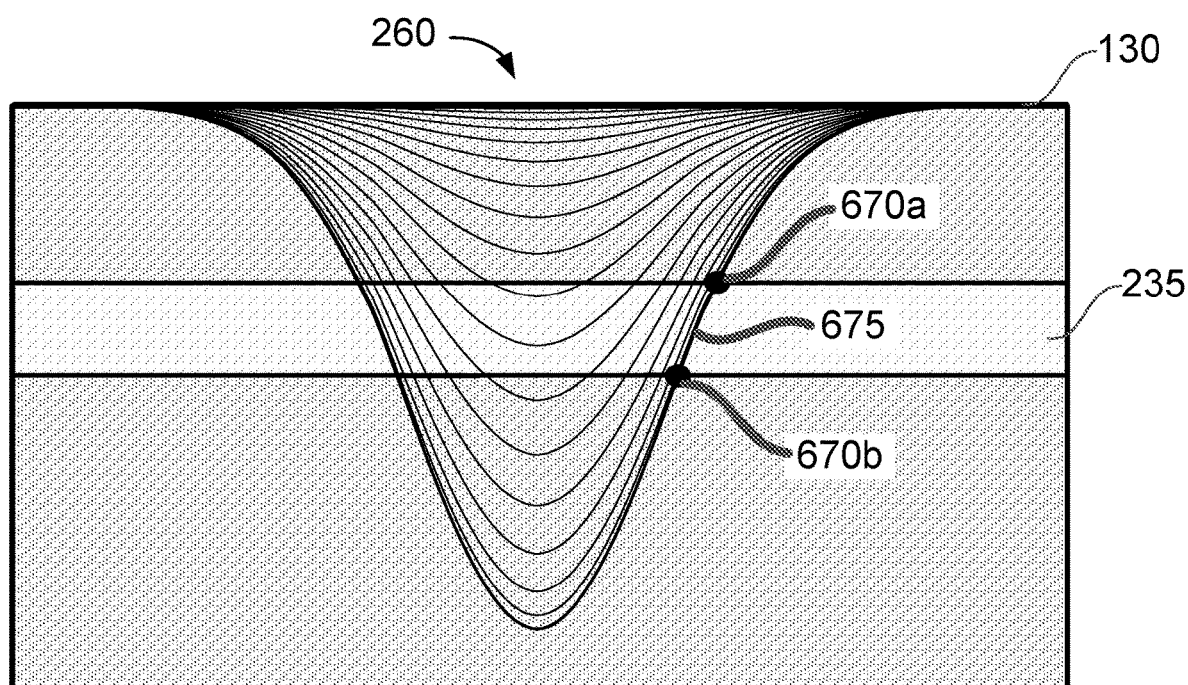

FIGS. 6a-6b are simplified cross-sectional views of a hole 260 milled in a sample 130 showing point 670a on an upper surface of a buried layer 235 and point 670b on a lower surface of the buried layer 235 according to some embodiments. The points 670a, 670b are typically at locations that have some feature or features that make the points 670a, 670b identifiable in the images.

In FIG. 6a, the points 670a, 670b appear to be aligned along a straight line. However, FIG. 6b is rotated 90° relative to FIG. 6a and shows that the points 670a, 670b are offset vertically since they are located on the sloped sidewall of the hole 260. Although they are offset vertically, the points 670a, 670b are directly above and below each other along the sloped sidewall so that the points 670a, 670b fall approximately on a line 675 extending vertically through the buried layer 235 as shown in FIG. 6a.

In practice, one of the points may be chosen, for example point 670a, and distances may be measured between the point 670a and other points at the lower surface of the buried layer 235 that appear to be directly below the point 670a. The point associated with the shortest distance may be identified as the point 670b. This should provide two points that fall approximately on a line 675 extending vertically through the buried layer 235 as shown in FIG. 6a.

In other embodiments, a plurality of vertical distances between first points on the sidewall corresponding to the upper surface of the buried layer and second points on the sidewall corresponding to the lower surface of the buried layer may be measured. The points having the shortest distance between them is closest to perpendicular to a line of sight. This shortest distance may be used in determining the vertical thickness of the buried layer.

Figure 7:
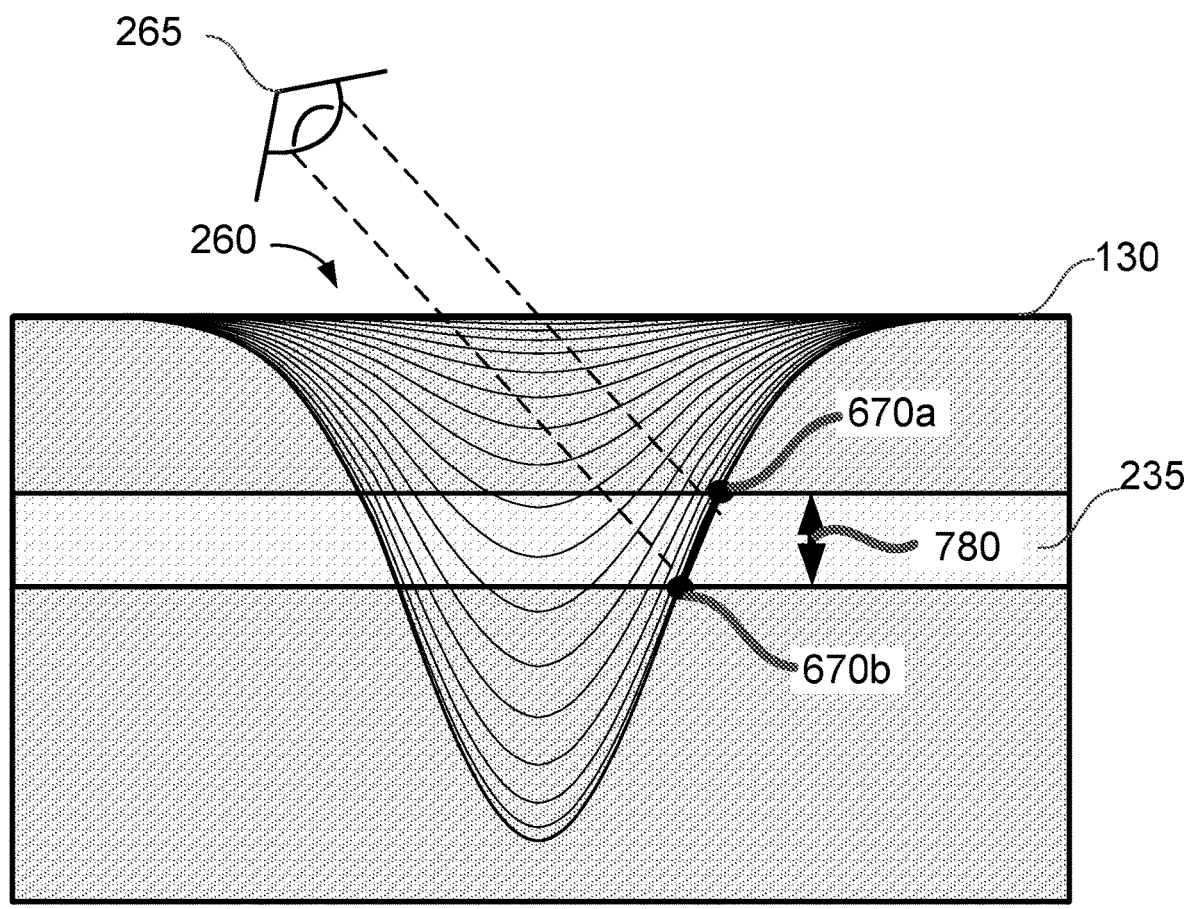
FIG. 7 is a simplified diagram illustrating some of the steps for determining a vertical thickness of a buried layer using a measured distance between points on upper and lower surfaces of the buried layer according to an embodiment.

FIG. 7 is a simplified diagram illustrating some of the steps for determining a vertical thickness 780 of a buried layer 235 using a measured distance between points 670a, 670b according to an embodiment. In this example, an image of the buried layer 235 is obtained from a perspective 265. A distance between the points 670a, 670b can be determined using known measurement techniques that may depend on the particular imaging device.

Figure 8:
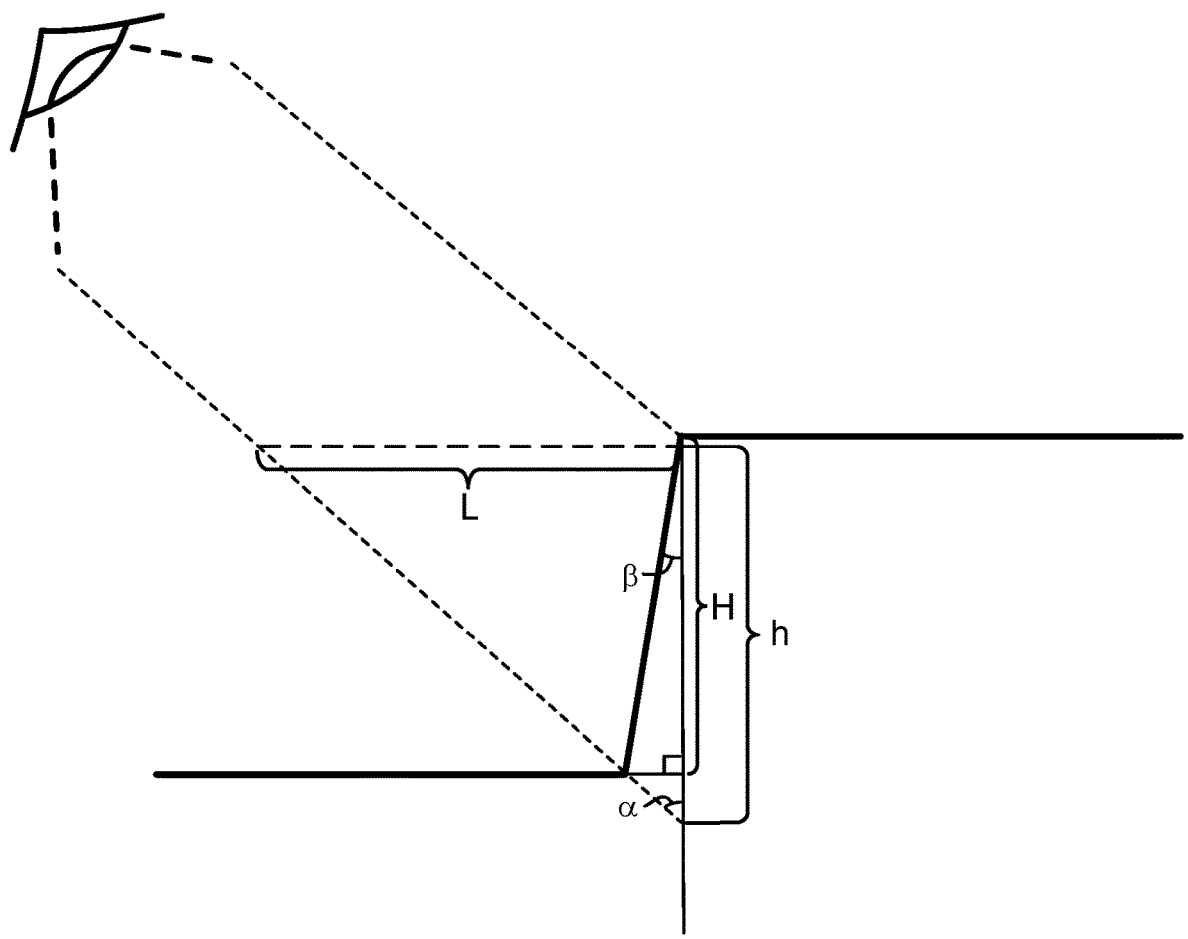
FIG. 8 is a simplified diagram illustrating how a vertical thickness of a buried layer can be determined according to an embodiment.

FIG. 8 is a simplified diagram illustrating how a vertical thickness of a buried layer can be determined according to an embodiment. For ease of illustration, upper and lower surfaces of the buried layer are represented in this figure by horizontal lines. The horizontal lines are connected by a line representing the sidewall of the buried layer that is sloped at an angle β from the vertical. Other layers above or below the buried layer are not shown in this example. In this example, an image of the sidewall is obtained from a perspective of a tilt angle α. The tilt angles α may be user defined and/or may be obtained from or determined by the imaging device. The vertical thickness of the buried layer is represented by H.

When analyzing features from a titled perspective, most conventional SEM imaging devices measure distance projected onto a horizontal or vertical plane. As an example, in FIG. 8, the distance projected onto the horizontal plane is L, and the distance projected onto the vertical plane is h. In accordance with an embodiment, these measured distances may be used along with the tilt angle α and the slope angle β to determine the vertical thickness of the buried layer H using, for example, an equation such as:

$$H = \frac{L}{\tan(\alpha) + \tan(\beta)} \quad (1)$$

$$H = \frac{h \tan(\alpha)}{\tan(\alpha) + \tan(\beta)} \quad (2)$$

In some embodiments, the perspective may be approximately 45° to the surface of the sample. In this configuration, the projected vertical thickness h is approximately equal to the projected horizontal thickness L.

Figure 9:
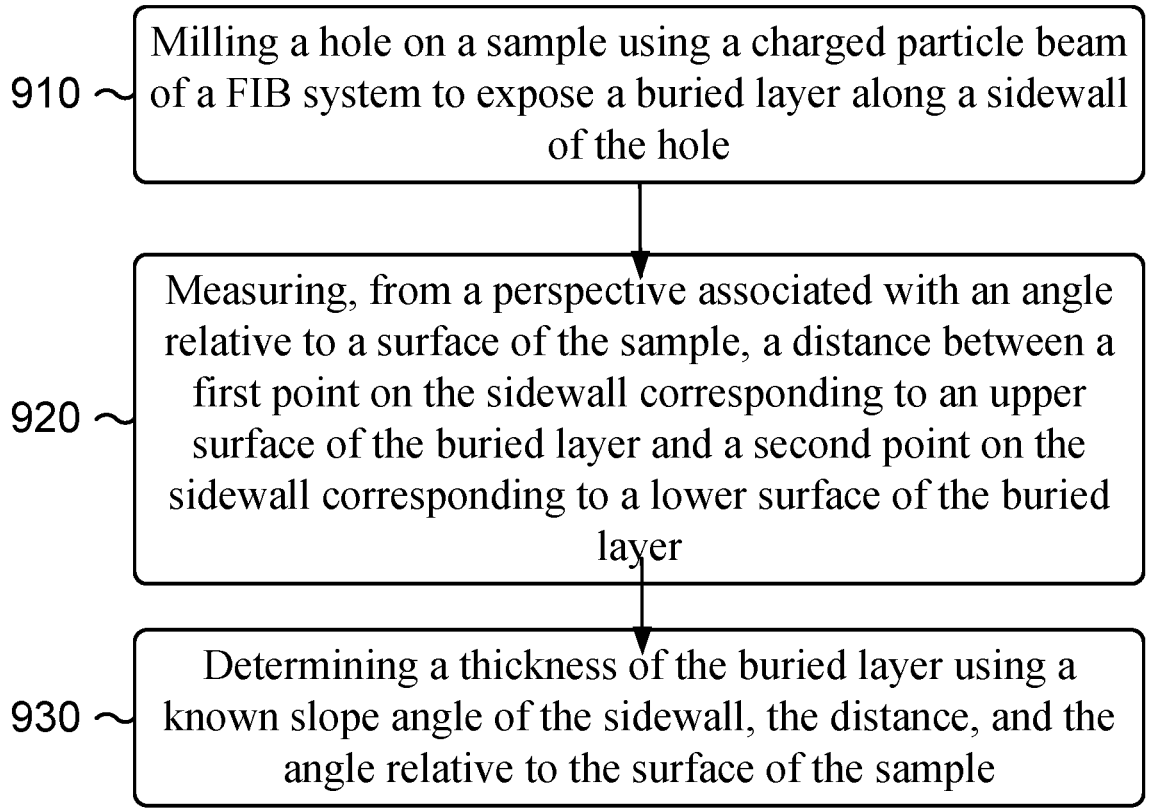
FIGS. 9-10 are flowcharts of exemplary methods of analyzing a sidewall of a hole milled in a sample to determine thickness of a buried layer according to some embodiments.
Figure 10:
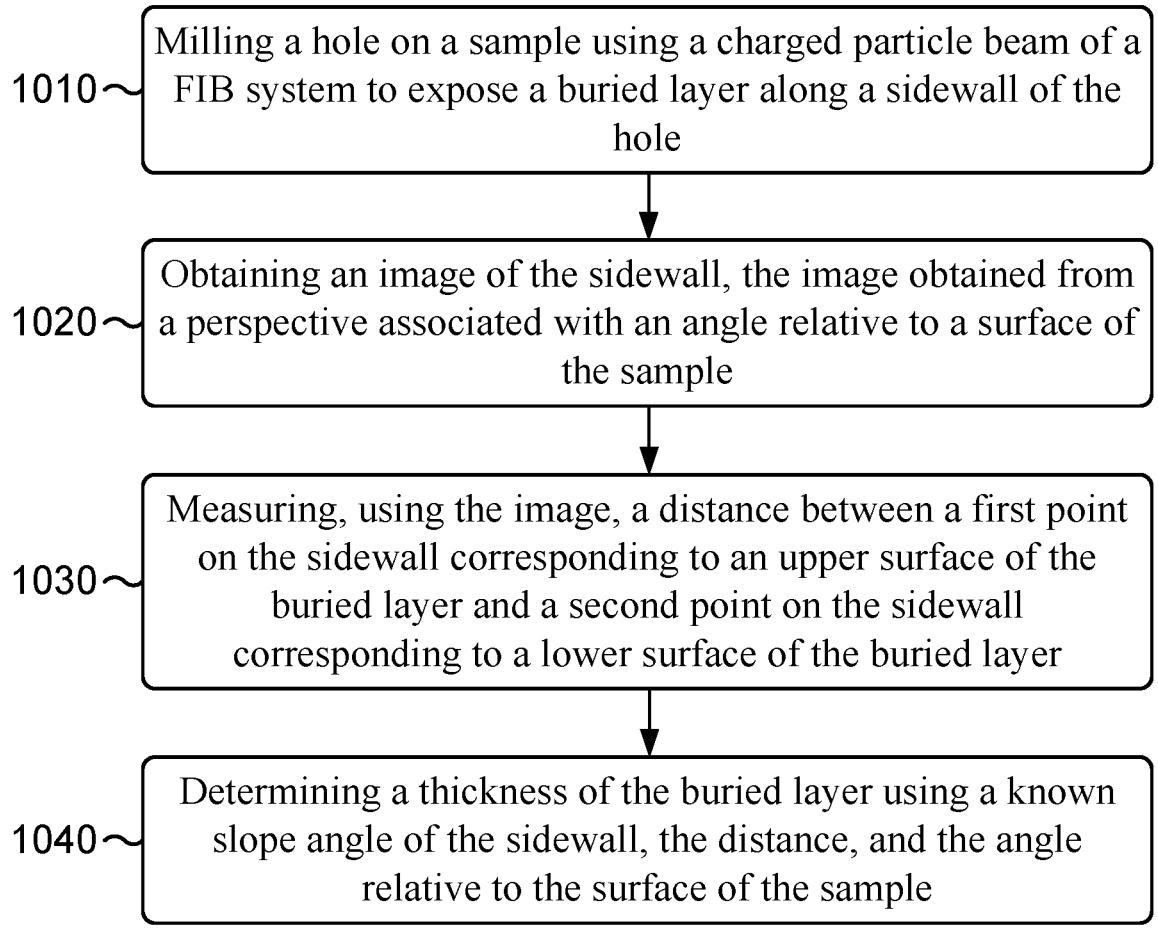

FIGS. 9-10 are flowcharts of exemplary methods of analyzing a sidewall of a hole milled in a sample to determine thickness of a buried layer according to some embodiments. The example of FIG. 9 includes milling a hole in a sample using a charged particle beam of a FIB system to expose a buried layer along a sidewall of the hole (910). The hole may be milled without scanning the charged particle beam, and the sidewall of the hole may be sloped after the milling. The sidewall has a known slope angle that approximates a beam profile. In some embodiments, the slope angle may have been determined previously using known cross sectioning and imaging techniques. The sample may be a semiconductor wafer.

The method also includes measuring, from a perspective associated with an angle relative to a surface of the sample, a distance between a first point on the sidewall corresponding to an upper surface of the buried layer and a second point on the sidewall corresponding to a lower surface of the buried layer (920). The distance may be measured using images obtained from a SEM system. In some embodiments, a plurality of distances may be measured between points on the upper and lower surfaces of the buried layer, and the distance may be a shortest one of the distances. The angle relative to the surface of the sample may be 0° (top down view) or tilted at an angle greater than 0° that still allows viewing the buried layer in the hole.

The method also includes determining a thickness of the buried layer using a known slope angle of the sidewall, the distance, and the angle relative to the surface of the sample (930). The angle relative to the surface may be the SEM angle or the perspective angle. The slope angle of the sidewall may be an input based on previous analysis and measurements of a similar sample. The thickness of the buried layer is a vertical distance between the upper surface of the buried layer and the lower surface of the buried layer. The thickness of the buried layer may be used to monitor a fabrication process. The fabrication process may be, for example, a film deposition or etch process.

The example of FIG. 10 includes milling a hole in a sample using a charged particle beam of a FIB system to expose a buried layer along a sidewall of the hole (1010). The hole may be milled without scanning the charged particle beam, and after the milling, the sidewall may have a known slope angle.

The method also includes obtaining an image of the sidewall, the image obtained from a perspective associated with an angle relative to a surface of the sample (1020), and measuring, using the image, a distance between a first point on the sidewall corresponding to an upper surface of the buried layer and a second point on the sidewall corresponding to a lower surface of the buried layer (1030).

The method also includes determining a thickness of the buried layer using the known slope angle of the sidewall, the distance, and the angle relative to the surface of the sample (1040).

It should be appreciated that the specific steps illustrated in FIGS. 9-10 provide particular methods for analyzing a buried layer according to some embodiments. Other sequences of steps may also be performed according to alternative embodiments. For example, alternative embodiments may perform the steps outlined above in a different order. Moreover, the individual steps illustrated in FIGS. 9-10 may include multiple sub-steps that may be performed in various sequences. Furthermore, additional steps may be added or removed depending on the particular application.

Also, configurations may be described as a process which is depicted as a schematic flowchart or block diagram. Although each may describe the operations as a sequential process, many of the operations can be performed in parallel or concurrently. Furthermore, examples of the methods may be implemented by hardware, software, firmware, middleware, microcode, hardware description languages, or any combination thereof. When implemented in software, firmware, middleware, or microcode, the program code or code segments to perform the necessary tasks may be stored in a non-transitory computer-readable medium such as a storage medium. Processors may perform the described tasks.

While the foregoing is directed to specific embodiments, other and further embodiments may be devised without departing from the basic scope thereof. For example, features of one or more embodiments of the invention may be combined with one or more features of other embodiments without departing from the scope of the invention. The specification and drawings are, accordingly, to be regarded in an illustrative rather than a restrictive sense. Thus, the scope of the present invention should be determined not with reference to the above description, but should be determined with reference to the appended claims along with their full scope of equivalents.

What is claimed is:

1. An inspection system for analyzing a sidewall of a hole milled in a sample to determine thickness of a buried layer, comprising:
   a focused ion beam (FIB) column;
   a scanning electron microscopy (SEM) column; and
   a computer readable medium comprising instructions that when executed cause the inspection system to perform steps comprising:
      milling the hole in the sample using a charged particle beam of the FIB column to expose the buried layer along the sidewall of the hole, wherein after milling the sidewall of the hole has a known slope angle;
      measuring, using the SEM column, a distance between a first point on the sidewall corresponding to an upper surface of the buried layer and a second point on the sidewall corresponding to a lower surface of the buried layer, wherein the measurement is obtained from a perspective associated with an angle relative to a surface of the sample, and the distance measured is projected onto a horizontal plane or a vertical plane; and
      determining the thickness of the buried layer using the known slope angle of the sidewall, the distance, and the angle relative to the surface of the sample.

2. The inspection system of claim 1 wherein the thickness of the buried layer is a vertical distance between the upper surface of the buried layer and the lower surface of the buried layer.

3. The inspection system of claim 1 wherein the angle relative to the surface of the sample is approximately 45°, and the distance projected onto the horizontal plane is the same as the distance projected onto the vertical plane.

4. The inspection system of claim 1 wherein a line extending vertically through the buried layer is approximately normal to the upper surface of the buried layer or the lower surface of the buried layer.

5. The inspection system of claim 1 wherein the computer readable medium further comprises instructions that when executed cause the inspection system to measure a plurality of distances between first points on the sidewall corresponding to the upper surface of the buried layer and second points on the sidewall corresponding to the lower surface of the buried layer, wherein the distance is a shortest one of the plurality of distances.

6. The inspection system of claim 1 wherein the computer readable medium further comprises instructions that when executed cause the inspection system to mill the hole with the charged particle beam in a de-focused mode.

7. The inspection system of claim 1 wherein the computer readable medium further comprises instructions that when executed cause the inspection system to mill the hole without scanning the charged particle beam.

8. The inspection system of claim 1 wherein the charged particle beam of the FIB column is generated using a plasma xenon source.

9. A method for analyzing a sidewall of a hole milled in a sample to determine thickness of a buried layer, the method comprising:
   milling the hole in the sample using a charged particle beam of a focused ion beam (FIB) column to expose the buried layer along the sidewall of the hole, wherein the hole is milled without scanning the charged particle beam, and after milling, the sidewall of the hole has a known slope angle;
   measuring, using a scanning electron microscopy (SEM) column, a distance between a first point on the sidewall corresponding to an upper surface of the buried layer and a second point on the sidewall corresponding to a lower surface of the buried layer, wherein the measurement is obtained from a perspective associated with an angle relative to a surface of the sample; and
   determining the thickness of the buried layer using the known slope angle of the sidewall, the distance, and the angle relative to the surface of the sample.

10. The method of claim 9 wherein the thickness of the buried layer is a vertical distance between the upper surface of the buried layer and the lower surface of the buried layer.

11. The method of claim 9 further comprising measuring a plurality of distances between first points on the sidewall corresponding to the upper surface of the buried layer and second points on the sidewall corresponding to the lower surface of the buried layer, wherein the distance is a shortest one of the plurality of distances.

12. The method of claim 9 wherein the hole is milled with the charged particle beam in a focused mode.

13. The method of claim 9 wherein the hole is milled with the charged particle beam in a de-focused mode.

14. The method of claim 9 wherein the charged particle beam is generated using a plasma xenon source.

15. The method of claim 9 wherein the buried layer on the sample underlies an overlying layer on the sample.

16. The method of claim 9 wherein the sample is a semiconductor wafer.

17. The method of claim 9 wherein the distance measured by the SEM column is projected onto a horizontal plane or a vertical plane.

18. The method of claim 9 further comprising monitoring a fabrication process using the thickness of the buried layer.

* * * * *